US006539524B1

United States Patent
Walden

(10) Patent No.: US 6,539,524 B1
(45) Date of Patent: Mar. 25, 2003

(54) METHOD AND APPARATUS FOR MATCHING CAPACITANCE OF FILTERS HAVING DIFFERENT CIRCUIT TOPOLOGIES

(75) Inventor: Robert William Walden, Bethlehem, PA (US)

(73) Assignee: Agere Systems Inc., Berkeley Heights, NJ (US)

( * ) Notice: Subject to any disclaimer, the term of this patent is extended or adjusted under 35 U.S.C. 154(b) by 0 days.

(21) Appl. No.: 09/567,606

(22) Filed: May 10, 2000

(51) Int. Cl.$^7$ .............................................. G06F 17/50
(52) U.S. Cl. ................................... 716/5; 716/4; 716/6
(58) Field of Search ....................................... 716/1–21

(56) References Cited

U.S. PATENT DOCUMENTS

| | | | | |
|---|---|---|---|---|
| 4,422,056 A | * | 12/1983 | Roberts | 333/177 |
| 4,441,082 A | * | 4/1984 | Haque | 330/129 |
| 4,554,508 A | * | 11/1985 | Haque | 329/101 |
| 4,720,670 A | * | 1/1988 | Boyle | 324/73 R |
| 4,894,620 A | * | 1/1990 | Nagaraj | 328/127 |
| 5,124,593 A | * | 6/1992 | Miche | 307/521 |
| 5,179,302 A | * | 1/1993 | Wagner | 307/521 |
| 5,337,606 A | * | 8/1994 | Bennett et al. | 73/517 |
| 5,561,381 A | * | 10/1996 | Jenkins et al. | 324/678 |
| 5,781,077 A | * | 7/1998 | Leitch et al. | 332/117 |
| 5,867,396 A | * | 2/1999 | Parlour | 364/489 |
| 6,031,986 A | * | 2/2000 | Milsom | 395/500.35 |
| 6,194,958 B1 | * | 2/2002 | Goldfarb et al. | 327/552 |

OTHER PUBLICATIONS

Kahng et al, "Improved Effective Capacitance Computations for use in Logic and Layout Optimization," IEEE, Jan. 1999, pp. 1–5.*

Macys et al, "A New Algorithm for Computing the "Effective Capacitance" in Deep Sub–Micron Circuits," IEEE, May 1998, pp. 313–316.*

Qian et al, "Modeling the "Effective Capacitance" for the RC Interconnect of CMOS Gates," IEEE, Dec. 1994, pp. 1526–1535.*

* cited by examiner

*Primary Examiner*—Vuthe Siek
(74) *Attorney, Agent, or Firm*—Ryan, Mason & Lewis, LLP

(57) ABSTRACT

A method and apparatus are provided for matching the primary and parasitic capacitances of integrated circuit capacitors. The integrated circuit capacitors to be matched in accordance with the present invention can be of different sizes and connected in different circuit topologies. For example, the matching filter can have a differential filter capacitor structure and the reference circuit can have a single-ended filter configuration (or vice versa). The reference circuit to be matched is initially analyzed to identify the ratio of the primary capacitance, $C_p$, to the parasitic capacitance, $C_g$. Thereafter, a matching filter is selected with the desired topology and having the same ratio of the primary capacitance, $C_p$, to the parasitic capacitance, $C_g$, as the reference circuit (or a desired offset therefrom). A general technique is disclosed for analyzing capacitance circuits to identify the ratio of the primary capacitance, $C_p$, to the parasitic capacitance, $C_g$.

16 Claims, 7 Drawing Sheets

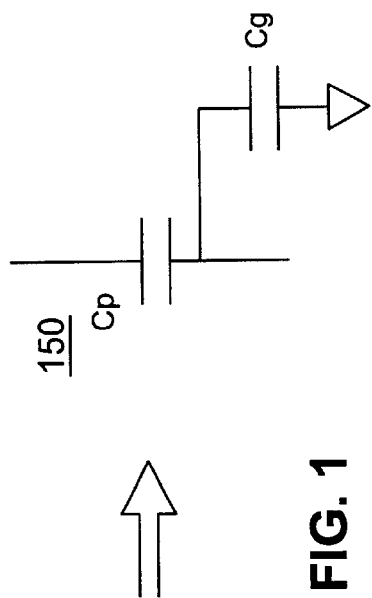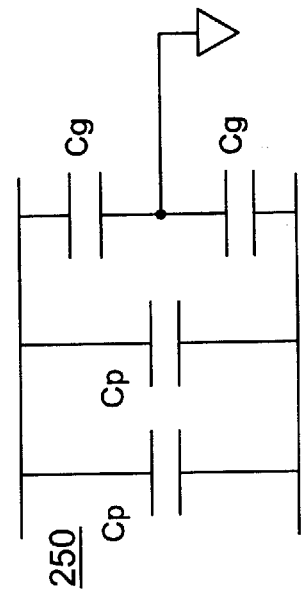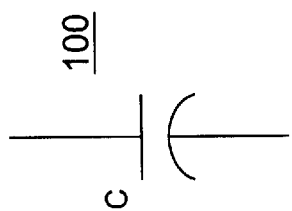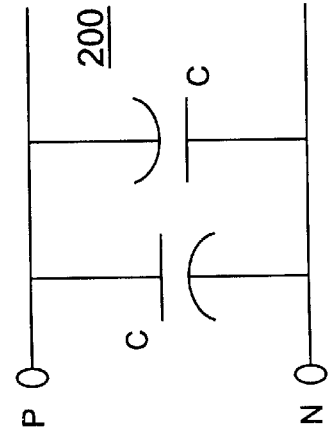
FIG. 1
FIG. 2

$$C_{eff} \cong \tfrac{1}{2}C_p + \tfrac{1}{8}C_g$$

$$C_{eff} = \tfrac{1}{2}C_p + \tfrac{1}{2}C_g$$

$C_{eff} = \frac{1}{2}Cp$ $C_{eff} \cong \frac{1}{2}Cp + \frac{1}{4}Cg$ $$C_{eff} = \tfrac{1}{2}C_p + C_g$$

$$C_{eff} \cong \tfrac{1}{2}C_p + \tfrac{5}{4}C_g$$

$$C_{eff} \cong \tfrac{1}{2} C_p + \tfrac{1}{2} C_g$$

METHOD AND APPARATUS FOR MATCHING CAPACITANCE OF FILTERS HAVING DIFFERENT CIRCUIT TOPOLOGIES

FIELD OF THE INVENTION

The invention is directed toward the field of continuous-time circuit filters, and more particularly, to a method and apparatus for matching the frequency characteristics of such continuous-time circuit filters having different circuit topologies.

BACKGROUND OF THE INVENTION

Continuous-time integrated circuit filters generally use combinations of resistors and capacitors as tuning elements to achieve desired frequency characteristics. Such continuous-time filters are used in many applications, including cellular telephones, high fidelity audio equipment, multi-media computers, and sensors. In many of these applications it is often necessary or desirable to achieve high precision in calibration and matching between different circuits that are expected to track each other. For example, in some applications it is necessary to match the pole frequency of a tuned filter to the pole frequency of a reference tuning circuit that may have a different topology. In addition, the matched circuits might also have constituent elements that must scale with each other, but which have substantially different electrical values, as is common in a multi-pole active filter.

It is therefore desirable to select circuit components when designing a filter that provide the necessary frequency characteristics. Nonetheless, process variations during fabrication and other factors can cause significant variations from chip to chip of resistance and capacitance values often resulting in frequency responses that differ significantly from the initial design. Since the frequency characteristics of a filter are primarily dependent upon the values of the resistors and capacitors comprising the filter, the frequency characteristics of a filter at the end of fabrication will not meet the tolerance requirements for the given application if the resistance and capacitance values of the filter are not clearly defined during the design stage.

There are many parasitic elements in continuous-time filters that make it difficult to precisely calibrate and match the frequency characteristics between different circuits that are expected to track each other. For example, it has been observed that the parasitic capacitance can be a substantial fraction of the primary capacitance (10% to 20% or more), depending on the capacitor structure of a given manufacturing process. In addition, there is generally little correlation between variations in the primary capacitance per unit area and the parasitic capacitance per unit area.

A need therefore exists for a method and apparatus for matching filter capacitors that have different circuit topologies, such as matching capacitors connected in a differential configuration with capacitors connected in a single-ended configuration, in such a way that both the primary capacitance and the parasitic capacitance are optimally matched. A further need exists for a method and apparatus that provide optimal matching of both primary and parasitic capacitances for integrated circuit capacitors which may be of different sizes and connected in different circuit topologies.

SUMMARY OF THE INVENTION

Generally, a method and apparatus are provided for matching the primary and parasitic capacitances of integrated circuit capacitors. The integrated circuit capacitors to be matched in accordance with the present invention can be of different sizes and connected in different circuit topologies. In accordance with the present invention, a matching filter may be selected that is matched in a desired manner to a reference circuit. The matching filter and the reference circuit can have a different topology. For example, the matching filter can have a differential filter capacitor structure and the reference circuit can have a single-ended filter configuration.

According to one aspect of the invention, the reference circuit to be matched is initially analyzed to identify the ratio of the primary capacitance, $C_p$, to the parasitic capacitance, $C_g$. Thereafter, a matching filter is selected with the desired topology and having the same ratio of the primary capacitance, $C_p$, to the parasitic capacitance, $C_g$, as the reference circuit (or a desired offset therefrom). A general technique is disclosed for analyzing capacitance circuits to identify the ratio of the primary capacitance, $C_p$, to the parasitic capacitance, $C_g$.

The present invention provides a way to match both primary and parasitic capacitances among filter and tuning circuits that incorporate capacitors with different circuit topologies, and thus match the circuit characteristics independently of process variations. Also, the implementation is simple, and the total capacitance required is about the same with or without this technique.

A more complete understanding of the present invention, as well as further features and advantages of the present invention, will be obtained by reference to the following detailed description and drawings.

BRIEF DESCRIPTION OF THE DRAWINGS

FIG. 1 illustrates an integrated circuit capacitor, C, and a corresponding equivalent structure;

FIG. 2 illustrates a differential filter capacitor structure having two capacitors, C, of the type shown in FIG. 1 and a corresponding equivalent structure;

DETAILED DESCRIPTION

The present invention provides a method and apparatus for optimal matching of both primary and parasitic capacitances for integrated circuit capacitors. The integrated circuit capacitors to be matched can be of different sizes and connected in different circuit topologies. As used herein, the term "matching" includes filter circuits having the same or substantially the same effective capacitance, $C_{eff}$, as well as filter circuits having a desired offset in the effective capacitance, $C_{eff}$, relative to one another.

FIG. 1 illustrates an integrated circuit capacitor, C, 100. As shown in FIG. 1, the capacitor, C, can be represented with an equivalent structure 150 having two components, namely, the primary capacitance, $C_p$, and the parasitic capacitance, $C_g$. It is noted that the capacitance notation used herein utilizes a curved plate on the side of the capacitor, C, that is grounded. The primary capacitance, $C_p$, is the capacitance measured between the two plates of the capacitor, C. The parasitic capacitance, $C_g$, is the capacitance measured between the bottom plate and ground.

FIG. 2 shows a differential filter capacitor structure 200 having two capacitors, C, (of the type shown in FIG. 1) differentially connected in parallel across nodes N and P. As 10 shown in FIG. 1, each capacitor, C, has a primary capacitance, $C_p$, and a parasitic capacitance from bottom plate to ground, $C_g$. The differential filter capacitor structure 200 can be represented with an equivalent circuit 250. FIG. 2 shows a typical configuration of a differential filter capacitor structure 200 where it is desirable to have two equal capacitors, C, connected back-to-back, so that the parasitic capacitance, $C_g$, to ground is the same for both of nodes N and P. Using the equivalent circuit 250, it can be seen that the effective capacitance, $C_{eff}$, of the differential filter capacitor structure 200 shown in FIG. 2 may be expressed as follows:

$$C_{eff} = 2C_p + \tfrac{1}{2}C_g$$

Figure 3:
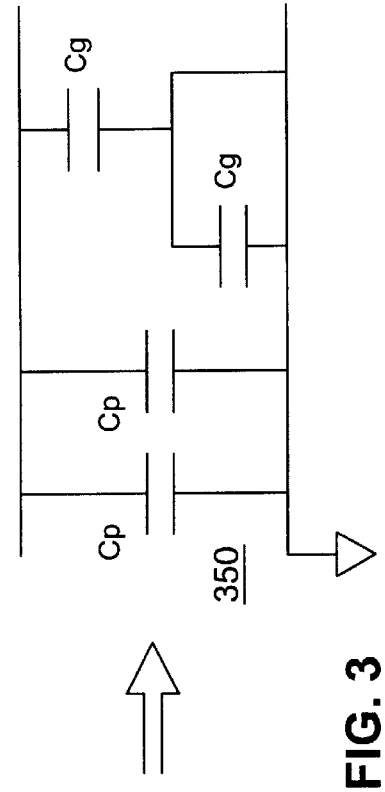
FIGS. 3, 4 and 5 illustrate various implementations of a single-ended filter configuration using two capacitors, C, of the type shown in FIG. 1 and a corresponding equivalent structure.
Figure 4:
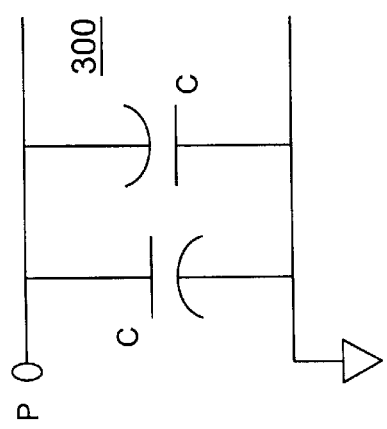
Figure 5:
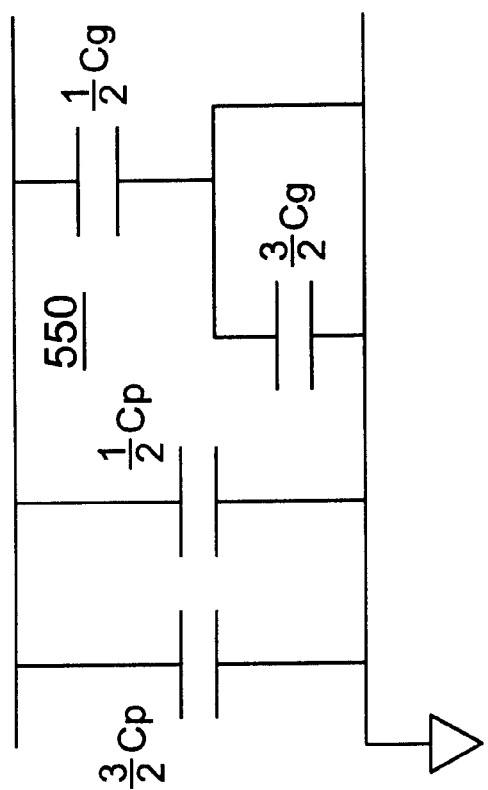
Figure 5:
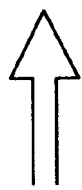
Figure 5:
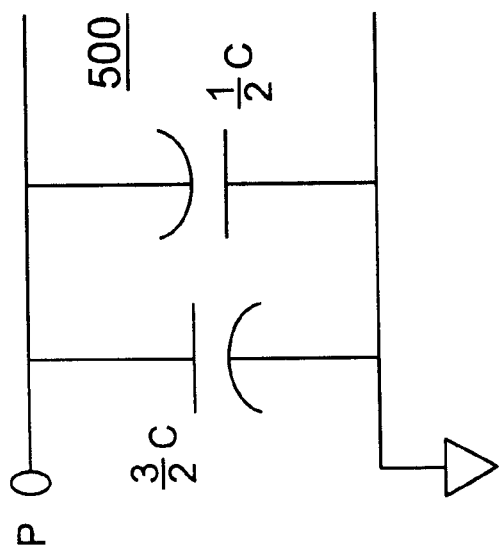

FIGS. 3, 4 and 5 show various implementations of a single-ended configuration 300, 400, 500 using two capacitors, C. The single-ended configuration 300 can be represented with an equivalent circuit 350, the single-ended configuration 400 can be represented with an equivalent circuit 450 and the single-ended configuration 500 can be represented with an equivalent circuit 550. The single-ended configurations 300, 400, 500 shown in FIGS. 3, 4 and 5 have the same primary capacitance, $C_p$, as the differential filter capacitor structure 200 shown in FIG. 2. Each single-ended configurations 300, 400, 500 shown in FIGS. 3, 4 and 5 have different parasitic capacitances, $C_g$.

Using the equivalent circuit 350, it can be seen that the effective capacitance, $C_{eff}$, of the single-ended configuration 300 shown in FIG. 3 may be expressed as follows:

$$C_{eff} = 2C_p + C_g$$

Using the equivalent circuit 450, it can be seen that the effective capacitance, $C_{eff}$, of the single-ended configuration 400 shown in FIG. 4 may be expressed as follows:

$$C_{eff} = 2C_p$$

Using the equivalent circuit 550, it can be seen that the effective capacitance, $C_{eff}$, of the single-ended configuration 500 shown in FIG. 5 may be expressed as follows:

$$C_{eff} = 2C_p + \tfrac{1}{2}C_g$$

Thus, if it is desired to match the primary capacitance and the parasitic capacitance in the same ratio for the differential circuit 200 of FIG. 2 and a single-ended circuit, the single-ended configuration 500 shown in FIG. 5 may be used.

Figure 6A:
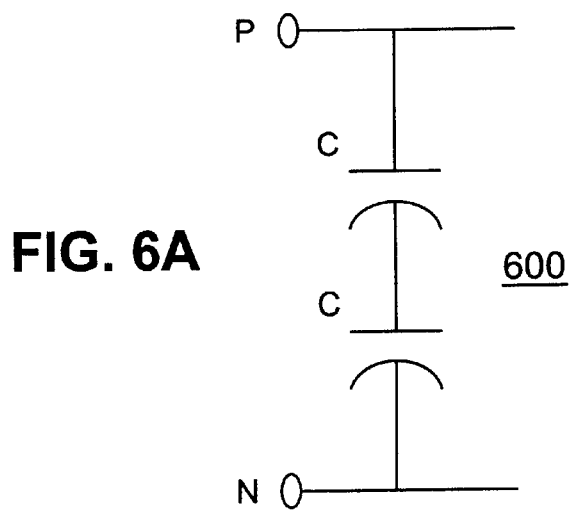
FIGS. 6A through 6C illustrate a number of differential filter capacitor structures in which the capacitors, C, are connected in series and a corresponding representation of the effective capacitance, $C_{eff}$, for each circuit.
Figure 6B:
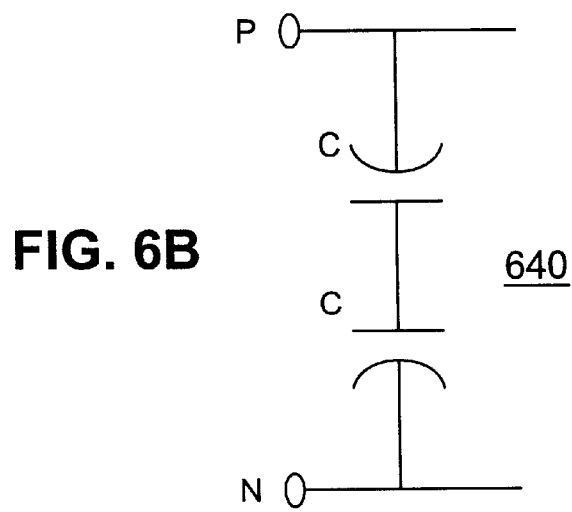
Figure 6C:
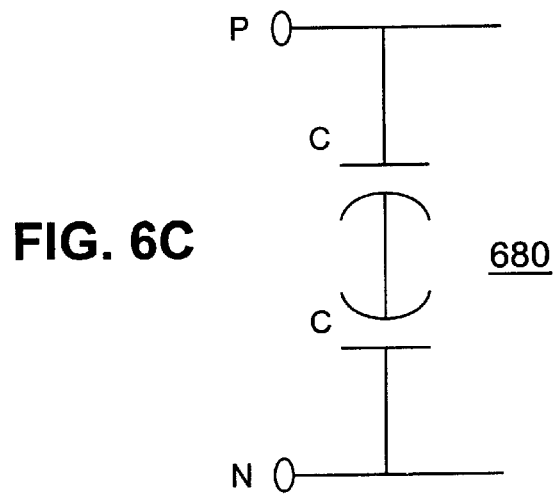
Figure 7A:
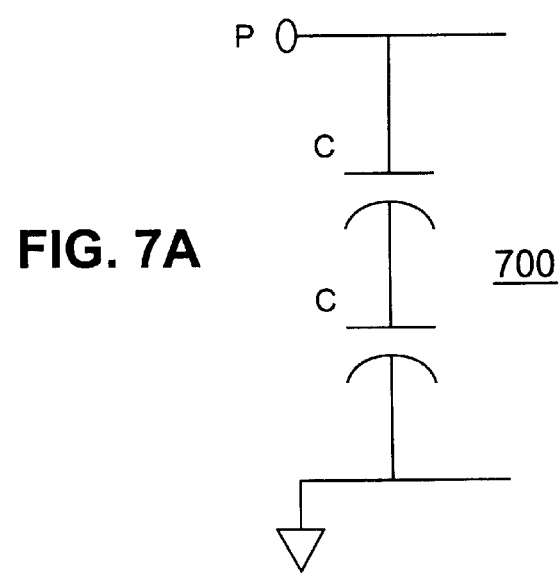
FIGS. 7A through 7D illustrate a number of single-ended filter capacitor structures in which the capacitors, C, are connected in series and a corresponding representation of the effective capacitance, $C_{eff}$, for each circuit.
Figure 7B:
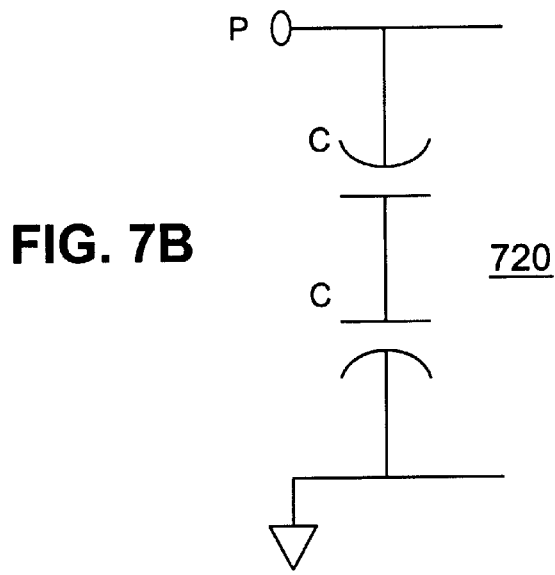
Figure 7C:
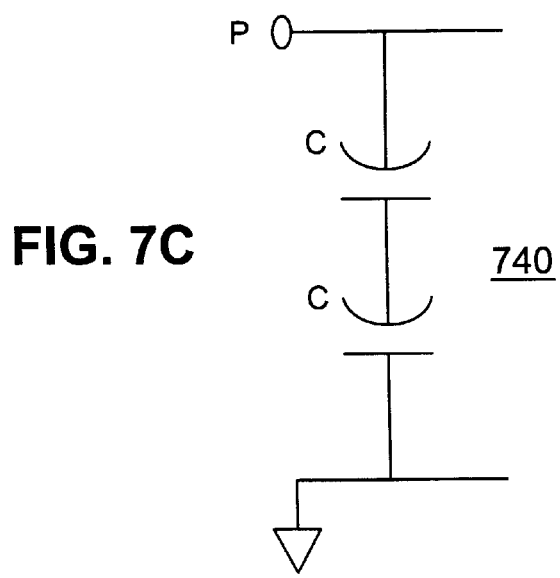
Figure 7D:
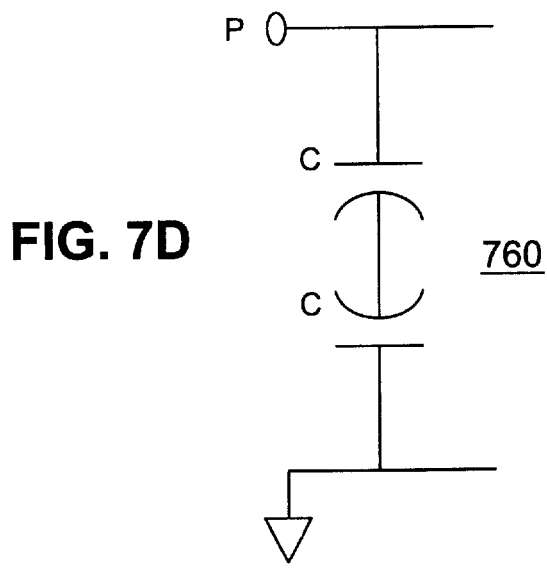

The methodology of the present invention may also be extended to other capacitance structures, such as those illustrated in FIGS. 6 and 7, for example, in which capacitors are connected in series rather than parallel. Each of the differential filter capacitor structures 600, 640, 680 shown in FIGS. 6A through 6C have the corresponding effective capacitance, $C_{eff}$, shown in the figure. Likewise, each of the single-ended filter capacitor structures 700, 720, 740, 760 shown in FIGS. 7A through 7D have the corresponding effective capacitance, $C_{eff}$, shown in the figure. Different ratios of primary capacitance, $C_p$, and parasitic capacitance, $C_g$, may be achieved by combinations of these various structures.

It is noted that the parasitic capacitance values, $C_g$, in some of the equations shown in FIGS. 6 and 7 are a first order approximation under the assumption that the parasitic capacitance is significantly smaller than the primary capacitance. The exact effective capacitance of the series combination 700 in FIG. 7A, for example, is given by:

$$C_{eff} = \left(\frac{1}{C_p} + \frac{1}{C_p + C_g}\right)^{-1} = C_p \frac{(1+x)}{(2+x)},$$

where $x = C_g/C_p$.

Other parasitic capacitances, such as top plate to ground, are usually small by comparison to $C_p$ and $C_g$, and are therefore not explicitly included here, but the technique of the present invention may also be applied to other parasitic components. Also, equal size capacitors are used in this illustration, since equal size capacitors are often desirable for matching or balance, but capacitors of unequal sizes may also be used. Series and/or parallel combinations of capacitors may be used to achieve other ratios between parasitic and primary capacitance, as would be apparent to a person of ordinary skill in the art, based on the disclosure herein.

Figure 8:
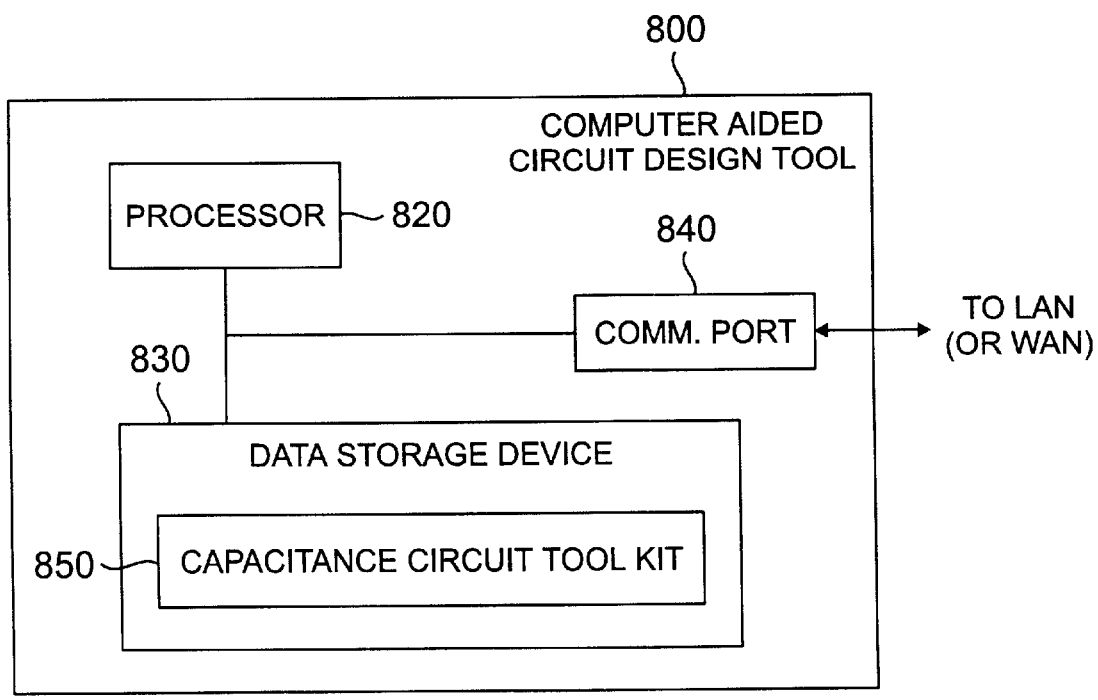
FIG. 8 is a schematic block diagram of an exemplary computer aided circuit design tool according to the present invention.

FIG. 8 is a schematic block diagram of an exemplary computer aided circuit design tool 800. The computer aided circuit design tool 800 may be embodied as any commercially available computer aided circuit design tool, such as the analog circuit simulation tools commercially available from Cadence Design Systems, Inc. of San Jose, Calif., as modified herein to provide the features and functions of the present invention. Specifically, as shown in FIG. 8, the computer aided circuit design tool 800 should include a tool kit 850 of filter circuits having a variety of topologies and various ratios of said primary capacitance, $C_p$, to the parasitic capacitance, $C_g$, such as those shown in FIGS. 2 through 7. The computer aided circuit design tool 800 includes certain standard hardware components, such as a processor 820, a data storage device 830, and, optionally, a communications port 840. The processor 820 can be linked to each of the other listed elements, either by means of a shared data bus, or dedicated connections, as shown in FIG. 8. The communications port 840 connects the computer aided circuit design tool 800, for example, to a LAN (not shown). The data storage device 830 is operable to store one or more instructions, which the processor 820 is operable to retrieve, interpret and execute in accordance with the present invention.

It is to be understood that the embodiments and variations shown and described herein are merely illustrative of the principles of this invention and that various modifications may be implemented by those skilled in the art without departing from the scope and spirit of the invention.

I claim:

1. A method for matching an effective capacitance of a reference circuit having a first topology to an effective capacitance of a matching circuit having a second topology, said method comprising the steps of:

analyzing said reference circuit to identify a ratio of a primary capacitance, $C_p$, to a parasitic capacitance, $C_g$; and selecting said matching circuit having said second topology and a substantially similar ratio of the primary capacitance, $C_p$, to the parasitic capacitance, $C_g$, as said reference circuit.

2. The method of claim 1, wherein said first and second topologies are a differential filter capacitor structure or a single-ended filter configuration.

3. The method of claim 1, wherein said primary capacitance, $C_p$, is the capacitance measured between the two plates of a capacitor, C.

4. The method of claim 1, wherein said parasitic capacitance, $C_g$, is the capacitance measured between the bottom plate of said capacitor, C, and ground.

5. The method of claim 4, wherein said parasitic capacitance, $C_g$, includes the capacitance measured between the top plate of said capacitor, C, to ground.

6. The method of claim 1, further comprising the step of providing a tool kit of filter circuits having a plurality of topologies and various ratios of said primary capacitance, $C_p$, to the parasitic capacitance, $C_g$.

7. A tuning circuit comprising:
 a reference circuit having a first topology including at least one capacitor, said reference circuit having a primary capacitance, $C_p$, and a parasitic capacitance, $C_g$; and
 a matching circuit having a second topology including at least one capacitor, said matching circuit selected to have an effective capacitance with a substantially similar ratio of the primary capacitance, $C_p$, to the parasitic capacitance, $C_g$, as said reference circuit.

8. The tuning circuit of claim 7, wherein said first and second topologies are a differential filter capacitor structure or a single-ended filter configuration.

9. The tuning circuit of claim 7, wherein said primary capacitance, $C_p$, is the capacitance measured between the two plates of a capacitor, C.

10. The tuning circuit of claim 7, wherein said parasitic capacitance, $C_g$, is the capacitance measured between the bottom plate of said capacitor, C, and ground.

11. The tuning circuit of claim 10, wherein said parasitic capacitance, $C_g$, includes the capacitance measured between the top plate of said capacitor, C, to ground.

12. A computer aided circuit design tool for designing a matching filter having an effective capacitance that matches a reference circuit, said reference circuit having a first topology and said matching circuit having a second topology, said computer aided circuit design tool comprising:
 a memory that stores computer-readable code and a tool kit of filter circuits having a plurality of topologies and various ratios of a primary capacitance, $C_p$, to a parasitic capacitance, $C_g$; and
 a processor operatively coupled to said memory, said processor configured to implement said computer-readable code, said computer-readable code configured to:
 analyze said reference circuit to identify a ratio of a primary capacitance, $C_p$, to a parasitic capacitance, $C_g$; and
 select said matching circuit having said second topology and a substantially similar ratio of the primary capacitance, $C_p$, to the parasitic capacitance, $C_g$, as said reference circuit.

13. The computer aided circuit design tool of claim 12, wherein said first and second topologies are a differential filter capacitor structure or a single-ended filter configuration.

14. The computer aided circuit design tool of claim 12, wherein said primary capacitance, $C_p$, is the capacitance measured between the two plates of a capacitor, C.

15. The computer aided circuit design tool of claim 12, wherein said parasitic capacitance, $C_g$, is the capacitance measured between the bottom plate of said capacitor, C, and ground.

16. The computer aided circuit design tool of claim 15, wherein said parasitic capacitance, $C_g$, includes the capacitance measured between the top plate of said capacitor, C, to ground.

\* \* \* \* \*